United States Patent
Kao et al.

(10) Patent No.: US 7,545,177 B1
(45) Date of Patent: Jun. 9, 2009

(54) METHOD AND APPARATUS FOR LEAKAGE CURRENT REDUCTION

(75) Inventors: Sean W. Kao, South Pasadena, CA (US); Tim Tuan, San Jose, CA (US); Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1 day.

(21) Appl. No.: 11/725,742

(22) Filed: Mar. 20, 2007

(51) Int. Cl.
H03K 19/096 (2006.01)
(52) U.S. Cl. .............................. 326/95; 326/98; 326/81; 326/83; 326/38
(58) Field of Classification Search .................... 326/81, 326/83, 95, 98, 33; 327/544
See application file for complete search history.

(56) References Cited

U.S. PATENT DOCUMENTS

| | | | |
|---|---|---|---|
| 6,208,171 B1 * | 3/2001 | Kumagai et al. | 326/121 |
| 6,239,614 B1 * | 5/2001 | Morikawa | 326/39 |
| 6,529,042 B1 * | 3/2003 | Hiramoto et al. | 326/83 |
| 6,768,335 B1 | 7/2004 | Young et al. | |
| 6,768,338 B1 | 7/2004 | Young et al. | |
| 6,949,951 B1 | 9/2005 | Young et al. | |
| 7,053,654 B1 | 5/2006 | Young et al. | |
| 7,279,926 B2 * | 10/2007 | Severson et al. | 326/33 |
| 2001/0052800 A1 * | 12/2001 | Mizuno | 327/1 |
| 2003/0218478 A1 * | 11/2003 | Sani et al. | 326/33 |
| 2006/0114025 A1 * | 6/2006 | Frenkil et al. | 326/81 |
| 2007/0047364 A1 * | 3/2007 | Chuang et al. | 365/226 |
| 2007/0085567 A1 * | 4/2007 | Berthold et al. | 326/86 |
| 2007/0159239 A1 * | 7/2007 | Rhee | 327/544 |
| 2007/0168899 A1 * | 7/2007 | Frenkil | 716/10 |
| 2007/0176642 A1 * | 8/2007 | Kursun et al. | 326/98 |
| 2007/0279100 A1 * | 12/2007 | Fallah et al. | 326/95 |

OTHER PUBLICATIONS

Anantha Chandrakasan et al.; *Design of High-Performance Microprocessor Circuits*; Chapter 3: "Techniques for Leakage Power Reduction"; IEEE Press; Oct. 2000; pp. 46-62.

Kaushik Roy et al.; "Leakage Current Mechanisms and Leakage Reduction Techniques in Deep-Submicrometer CMOS Circuits"; Copyright 2003 IEEE; Proceedings of the IEEE, vol. 91, No. 2; Feb. 2003; pp. 305-327.

James w. Tschanz et al.; "Dynamic Sleep Transistor and Body Bias for Active Leakage Power Control of Microprocessors"; Copyright 2003 IEEE; IEEE Journal of Solid-State Circuits, vol. 38, No. 11; Nov. 2003; pp. 1838-1845.

Changbo Long et al.; "Distributed Sleep Transistor Network for Power Reduction"; Copyright 2004 IEEE; IEEE Transactions on Very Large Scale Integration (VLSI) Systems, vol. 12, No. 9; Sep. 2004; pp. 937-946.

(Continued)

*Primary Examiner*—Vibol Tan
(74) *Attorney, Agent, or Firm*—Michael T. Wallace; Michael R. Hardaway

(57) ABSTRACT

Leakage current reduction from a logic block is implemented via power gating transistors that exhibit increased gate oxide thickness as compared to the thin-oxide devices of the power gated logic block. Increased gate oxide further allows increased gate to source voltage differences to exist on the power gating devices, which enhances performance and reduces gate leakage even further. Placement of the power gating transistors in proximity to other increased gate oxide devices minimizes area penalties caused by physical design constraints of the semiconductor die.

18 Claims, 7 Drawing Sheets

OTHER PUBLICATIONS

Pietro Babighian et al.; "Sizing and Characterization of Leakage-Control Cells for Layout-Aware Distributed Power-Gating"; Copyright 2004 IEEE; Proceedings of the Design, Automation and Test in Europe Conference and Exhibition (Date'04); pp. 1-2, month unknown.

Tim Tuan et al.; "A 90nm Low-Power FPGA for Battery-Powered Applications"; FPGA'06; Copyright 2006 ACM; Feb. 22-24, 2006; pp. 1-9.

U.S. Appl. No. 10/783,216, filed Feb 20, 2004, Tuan et al.
U.S. Appl. No. 10/783,589, filed Feb. 20, 2004, Look et al.
U.S. Appl. No. 11/196,179, filed Aug. 3, 2005, Rahman et al.

* cited by examiner

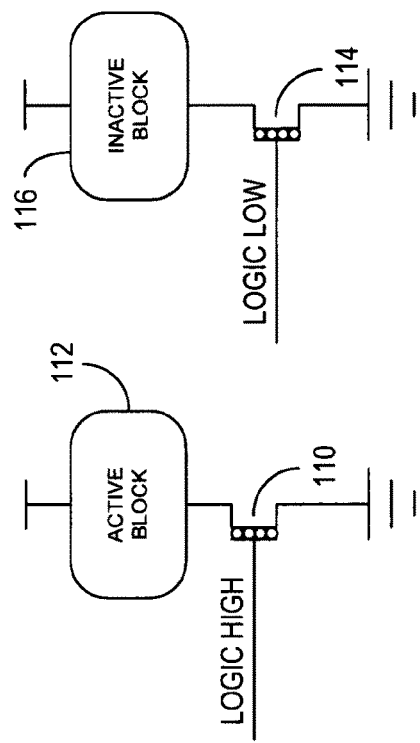
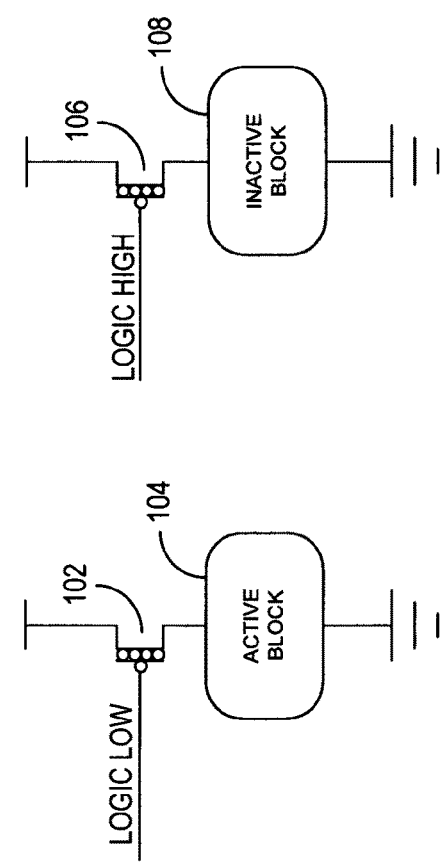
FIG. 1A  FIG. 1B  FIG. 1C  FIG. 1D

METHOD AND APPARATUS FOR LEAKAGE CURRENT REDUCTION

FIELD OF THE INVENTION

The present invention generally relates to programmable logic devices (PLDs), and more particularly to PLDs exhibiting decreased leakage current architectures.

BACKGROUND

Programmable logic devices (PLDs) are useful for a wide range of applications in which in-field programmability is desired. In addition, PLDs, such as field programmable gate arrays (FPGAs), provide a platform that facilitates reduced time to market with an extended product lifetime. FPGAs, however, have not been utilized to their full potential in certain power sensitive applications.

For example, while FPGAs are readily found in applications where operational power is plentiful, battery-powered applications tend towards implementations that utilize application specific integrated circuits (ASICs), since ASICs generally consume less power than FPGAs and may also incorporate power management features not generally found in FPGAs. Microprocessors and digital signal processors (DSPs) are also often selected for battery-powered applications, such as mobile communications, due in part to their ease of programmability and their extensive power management features. Power management features of processor based implementations, for example, can exhibit very low power consumption during inactive or standby periods.

Battery-powered applications, such as a mobile device in a mobile communications network, generally have two power modes: active power mode and standby power mode. Standby power mode is generally the predominant power mode, since a typical user application exhibits a very low duty cycle, whereby the mobile device is active for a short period of time, e.g., one hour, and inactive for a longer period of time, e.g., several hours to several days. As such, standby power mode, especially for battery-powered applications, tends to consume far less power than the active power mode, so as to extend the battery life of the mobile device.

Since FPGAs have conventionally been utilized for high-throughput processing applications with virtually unlimited energy supply, current FPGA architectures exhibit little or no power management capability. Accordingly, FPGA power consumption during the standby power mode may exceed the standby power consumption requirement for battery-powered applications by several orders of magnitude. FPGA power consumption is further exacerbated by the increase in leakage power due to downward scaling of transistor geometries in advanced semiconductor processing technologies.

Power gating transistors, also known as sleep transistors, have therefore been used to provide a gated connection from logic blocks within the FPGA to either the power supply node, or the reference supply node, or both, in order to reduce power consumption of the logic block when it is deactivated. In particular, if the logic block is active, then the power gating transistor is also activated, which provides a virtual ground connection, or a virtual power supply connection, or both, to the active logic block. If the logic block is inactive, on the other hand, then the power gating transistor is deactivated, which substantially eliminates any leakage current path that may exist from the deactivated logic block to either of the power supply node or reference supply node.

In such implementations, only the power gating transistor substantially contributes to the leakage current of the power gated logic block. By increasing the threshold voltage, $V_t$, of the power gating transistor, the leakage current may be further reduced. Power gating transistors, however, have conventionally been placed within the logic core of the FPGA. Thus, further reduction of the leakage current in the power gating transistors is substantially limited by the advancing processing technologies. Alternative power gating structures, therefore, continue to be developed, so that FPGAs may be increasingly utilized in low power consumption applications, even when the logic core device geometries of the FPGAs are reduced.

SUMMARY

To overcome limitations in the prior art, and to overcome other limitations that will become apparent upon reading and understanding the present specification, the present invention discloses an apparatus and method for leakage current reduction. In particular, physical design and alternate placement of power gate transistors are used to reduce gate leakage from power gated blocks, while additional circuitry may be used for the prevention of short circuit current that may exist at the interface between a functional logic block and a power gated logic block.

In accordance with one embodiment of the invention, a circuit comprises a first logic block that is coupled to a first voltage node through a first transistor. The first transistor exhibits a thicker gate oxide relative to transistors of the first logic block. The leakage current reduction circuit further comprises a second logic block that is coupled to a second voltage node through a second transistor. The second transistor exhibits a thicker gate oxide relative to transistors of the second logic block.

In accordance with another embodiment of the invention, an integrated circuit (IC) is configured to reduce leakage current. The IC comprises a plurality of logic blocks, where each logic block includes logic transistors having a first gate oxide thickness. The IC further includes a plurality of memory cell blocks, where each memory cell block includes a plurality of memory cells. The memory cells include transistors having a second gate oxide thickness. The IC further includes a plurality of power gating blocks, where each power gating block includes a plurality of power gating transistors having the second gate oxide thickness. The plurality of power gating blocks are located adjacent to the plurality of memory cell blocks and the plurality of power gating transistors are adapted to provide programmable power supply and power supply reference connections to the logic blocks to substantially reduce leakage current from the logic blocks.

In accordance with another embodiment of the invention, a leakage current reduction circuit comprises a first logic block that is void of power gating transistors, where the first logic block includes transistors of a first gate oxide thickness. The leakage current reduction circuit further comprises a second logic block that is coupled to the first logic block, where the second logic block includes a power gating transistor having a second gate oxide thickness greater than the first oxide thickness.

BRIEF DESCRIPTION OF THE DRAWINGS

Various aspects and advantages of the invention will become apparent upon review of the following detailed description and upon reference to the drawings, in which:

FIGS. 1A-1D illustrate various implementations of power gating transistors;

DETAILED DESCRIPTION

Figure 2:
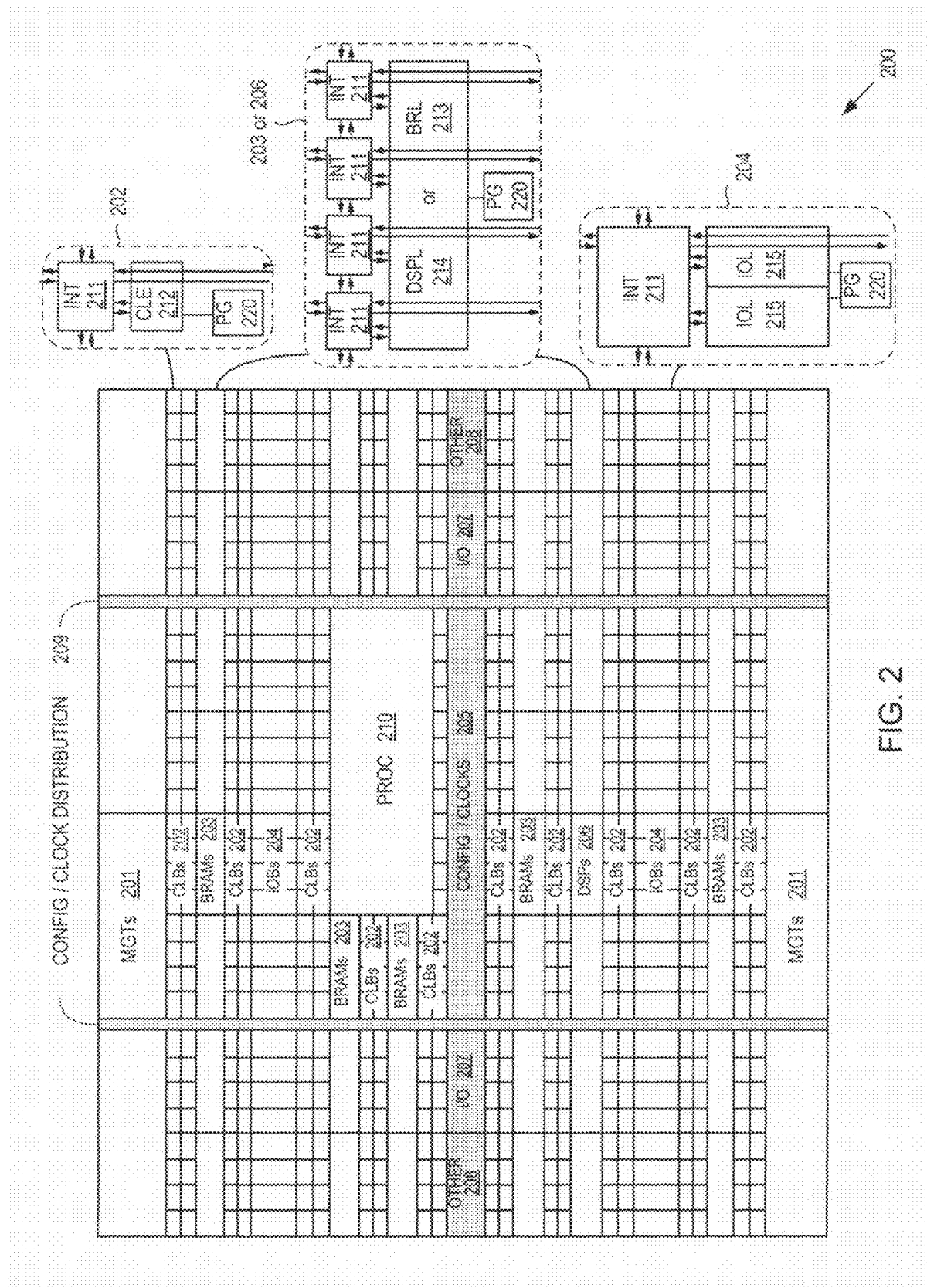
FIG. 2 illustrates an exemplary block diagram of an integrated circuit exhibiting power gated logic blocks.

Generally, the present invention is applied to the field of integrated circuits (ICs), of which programmable logic devices (PLDs) are a subset. In particular, a method and apparatus is provided to reduce power consumption due to gate leakage current, which is a growing percentage of the total power consumption in modern digital electronics due to advancing process technology.

As the geometry of a device shrinks, for example, so does the associated gate oxide thickness of the device, which has profound effects on the magnitude of gate leakage current as described in equation (1):

$$I_{GATE\text{-}LEAKAGE} = A \frac{V_{OX}^2}{T_{OX}^2} e^{\frac{-BT_{OX}}{V_{OX}}} \quad (1)$$

where $T_{OX}$ is the gate oxide thickness of the device, $V_{OX}$ is the voltage across the gate oxide, and A and B are constants. As can be seen, the gate leakage current, $I_{GATE\text{-}LEAKAGE}$, is exponentially dependent on the gate oxide thickness, $T_{OX}$, of the device. It can be verified that a decrease in gate oxide thickness, $T_{OX}$, of 6 angstroms increases gate leakage current by a factor of 1000. In some 90 nm processes, gate leakage current may account for up to half of the total leakage current depending upon temperature. 65 nm designs are projected to have gate leakage current account for the majority of leakage current depending upon temperature.

Circuit implementations using power gating transistors are provided, therefore, to virtually isolate potential leakage paths from their respective power supply and/or power supply reference connections. Power gating transistors may be used, for example, to isolate inactive logic blocks from their respective power supply and/or power supply reference connections. Similarly, power gating transistors may also be used to virtually isolate an entire system from leakage current paths when the system is in a standby, or sleep mode. Conversely, power gating transistors may be used to provide virtual power supply and/or power supply reference connections to systems, or individual logic blocks, that are active. In such instances, the power gating transistors may be rendered conductive to create the virtual connections.

Turning to FIGS. 1A-1D, the power gating transistor is identified by the "bubbled gate" notation, to indicate that the power gating transistors are generated with an increased gate oxide thickness as compared to the gate oxide thickness of devices in active blocks 104, 112 and inactive blocks 108, 116. Power gating transistors 102, 106, 110, and 114 exhibit an increased oxide thickness primarily to suppress the tunneling current through the gate of the power gating transistor.

Unlike conventional power gating transistors, the power gating transistors of FIGS. 1A-1D are not implemented using logic core devices, since logic core devices exhibit relatively thin gate oxide thickness. For example, most modern digital ICs utilize at least two types of transistors. A thin oxide, high performance transistor, for example, is typically utilized in the logic core of the IC, e.g., active blocks 104, 112 and inactive blocks 108, 116, to enhance speed of operation and energy consumption. A thick oxide transistor, on the other hand, is typically used in the input/output (I/O) portion of the IC to accommodate the higher voltage levels that may be required by the particular I/O standard being implemented by the I/O portion of the IC.

As such, power gating transistors 102, 106, 110, and 114 are subject to different design rules as compared to the design rules of the logic core devices in active blocks 104, 112 and inactive blocks 108, 116. In addition, due to the increased gate oxide thickness, power gating transistors 102, 106, 110, and 114 may be controlled with enhanced magnitude control voltages as compared to the logic core devices of active blocks 104, 112 and inactive blocks 108, 116.

For example, during active mode the control voltage of each thick oxide power gating transistor may be raised to a magnitude greater than the nominal supply voltage, e.g., $V_{dd}$, for N-type power gating transistors. Conversely, the control voltage of each thick oxide power gating transistor may be lowered to a magnitude less than the supply reference voltage, e.g., ground potential, for P-type power gating transistors. In such instances, the on-resistance of each thick oxide power gating transistor may be lower than the on-resistance of a thin oxide power gating transistor that has been traditionally used within the logic core.

Additionally, during inactive mode the control voltage of each thick oxide power gating transistor may be raised to a magnitude greater than the nominal supply voltage, e.g., $V_{dd}$, for P-type power gating transistors. Conversely, the control voltage of each thick oxide power gating transistor may be lowered to a magnitude less than the supply reference voltage, e.g., ground potential, for N-type power gating transistors. In such instances, the subthreshold leakage of the power gating transistors is further suppressed, thereby further suppressing leakage current for each inactive block that is power gated by the thick oxide power gating transistors.

In other embodiments, a bias may be applied to the body portion of the power gating transistors. Through application of the body bias, the threshold voltage, $V_t$, of the power gating transistor may be lowered to enhance performance in the active mode. Conversely, the threshold voltage, $V_t$, of the power gating transistor may be raised to further limit leakage current in the inactive mode.

FIG. 1A illustrates P-type power gating transistor 102, which effectively provides a virtual power supply connection to active block 104. Placing a logic low value at the gate terminal of power gating transistor 102 creates a negative gate-source voltage, $V_{GS}$, across power gating transistor 102. As such, power gating transistor 102 is placed into a conductive state, which creates a virtual power supply connection for active block 104 at the drain terminal of power gating transistor 102.

FIG. 1B illustrates P-type power gating transistor 106, which effectively isolates inactive block 108 from the power supply. Placing a logic high value at the gate terminal of power gating transistor 106 creates a positive, or at least a zero, gate-source voltage, $V_{GS}$, across power gating transistor 106. As such, power gating transistor 106 is placed into a non-conductive state, which effectively isolates inactive block 108 from the power supply connection, thereby substantially removing any leakage current path between inactive block 108 and its power supply connection.

FIG. 1C illustrates N-type power gating transistor 110, which effectively provides a virtual power supply reference connection to active block 112. Placing a logic high value at the gate terminal of power gating transistor 110 creates a positive gate-source voltage, $V_{GS}$, across power gating transistor 110. As such, power gating transistor 110 is placed into a conductive state, which creates a virtual power supply reference connection for active block 112 at the drain terminal of power gating transistor 110.

FIG. 1D illustrates N-type power gating transistor 114, which effectively isolates inactive block 116 from the power supply reference. Placing a logic low value at the gate terminal of power gating transistor 114 creates a negative, or at least a zero, gate-source voltage, $V_{GS}$, across power gating transistor 114. As such, power gating transistor 114 is placed into a non-conductive state, which effectively isolates inactive block 116 from the power supply reference connection, thereby substantially removing the leakage current path between inactive block 116 and its power supply reference connection.

In alternate embodiments of FIGS. 1A and 1C, double power gating may be provided on both sides of active blocks 104 and 112, respectively, such that both a virtual power supply connection and a virtual power supply reference connection is provided to active blocks 104 and/or 112. Similarly, double power gating may be provided in FIGS. 1B and 1D on both sides of inactive blocks 108 and 116, respectively, such that both the power supply connection and the power supply reference connection are effectively isolated from inactive blocks 108 and 116.

As noted above, advanced ICs such as FPGAs can include several different types of programmable logic blocks in the array, wherein each programmable logic block may be power gated as exemplified in FIGS. 1A-1D. For example, FIG. 2 illustrates an IC that exemplifies FPGA architecture 200, including a large number of different programmable tiles such as Multi-Gigabit Transceivers (MGTs) 201, Configurable Logic Blocks (CLBs) 202, dedicated Random Access Memory Blocks (BRAMs) 203, Input/Output Blocks (IOBs) 204, configuration and clocking logic CONFIG/CLOCKS 205, Digital Signal Processing blocks (DSPs) 206, specialized I/O 207, including configuration ports and clock ports, and other programmable logic 208, such as digital clock managers, analog-to-digital converters, system monitoring logic, and so forth. Some FPGAs also include dedicated processor blocks PROC 210, in which specific CPU related functionality may be utilized that is separate from the FPGA fabric.

In some FPGAs, each programmable tile includes programmable interconnect element INT 211 having standardized connections to and from a corresponding interconnect element in each adjacent tile. Therefore, the programmable interconnect elements taken together implement the programmable interconnect structure for the illustrated FPGA. INT 211 also includes the connections to and from the programmable logic element within the same tile, as shown by the examples of blocks 202 and 204, as well as power gating block 220 as discussed above, for example, in relation to FIGS. 1A-1D.

CLB 202, for example, may include a Configurable Logic Element CLE 212 that may be programmed to implement user logic plus a single programmable interconnect element INT 211. Power gating block 220 may be implemented to provide virtual power supply and power supply reference connection/isolation to/from CLE 212 and/or INT 211.

BRAM 203 can include a BRAM logic element (BRL 213) in addition to one or more programmable interconnect elements. Typically, the number of interconnect elements included in a tile depends on the height of the tile (as measured from right to left of FIG. 2). In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. Power gating block 220 may be implemented to provide virtual power supply and power supply reference connection/isolation to/from DSPL 214, BRL 213 and/or INT 211.

IOB 204 may include, for example, two instances of an input/output logic element IOL 215 in addition to one instance of the programmable interconnect element INT 211. Power gating block 220 may be implemented to provide virtual power supply and power supply reference connections to IOL 215 and/or INT 211.

In the pictured embodiment, a columnar area near the center of the die (shown shaded in FIG. 2) may be used for configuration, clock, and other control logic. Horizontal areas 209 extending from this column (shown as vertical areas in FIG. 2) may also be used to distribute the clocks and configuration signals across the breadth of the FPGA.

Figure 3:
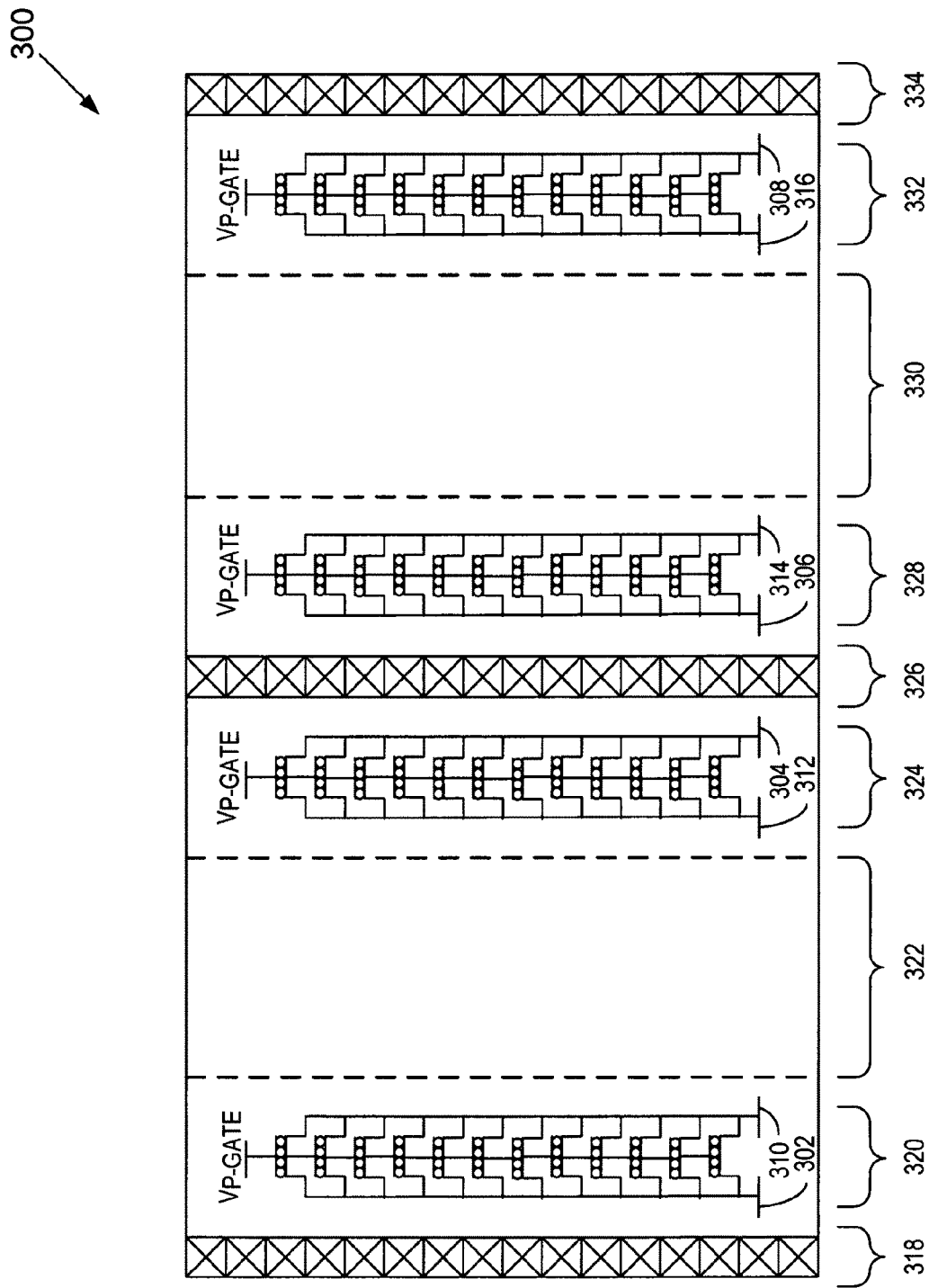
FIG. 3 illustrates an exemplary layout of power gating transistors.

Turning to FIG. 3, one embodiment of an exemplary layout is presented, whereby increased thickness power gating transistor blocks 320, 324, 328, and 332 are strategically placed. In particular, since the power gating transistors of blocks 320, 324, 328, and 332 are implemented with thicker gate oxides, physical design constraints suggest that separation of power gating transistor blocks 320, 324, 328, and 332 from logic core portions 322 and 330 is desired.

Furthermore, mid-oxide devices are often used to implement memory cell blocks 318, 326 and 334 in order to reduce gate leakage. By implementing the power gating transistors with the same mid-oxide process as used for memory cell blocks 318, 326 and 334, for example, the area penalty of the physical separation constraints between blocks 318/320, 324-328, and 332/334 may be reduced.

Conduction terminals 310-316 may represent the drain terminals of N-type, or P-type, power gating transistors of blocks 320, 324, 328, and 332, respectively. Thus, conduction terminals 310-316 may represent the virtual connection from devices within logic core blocks 322 and 330 to either of a power supply, or a power supply reference connected at source terminals 302-308 as discussed above, for example, in relation to FIGS. 1A-1D.

Figure 4:
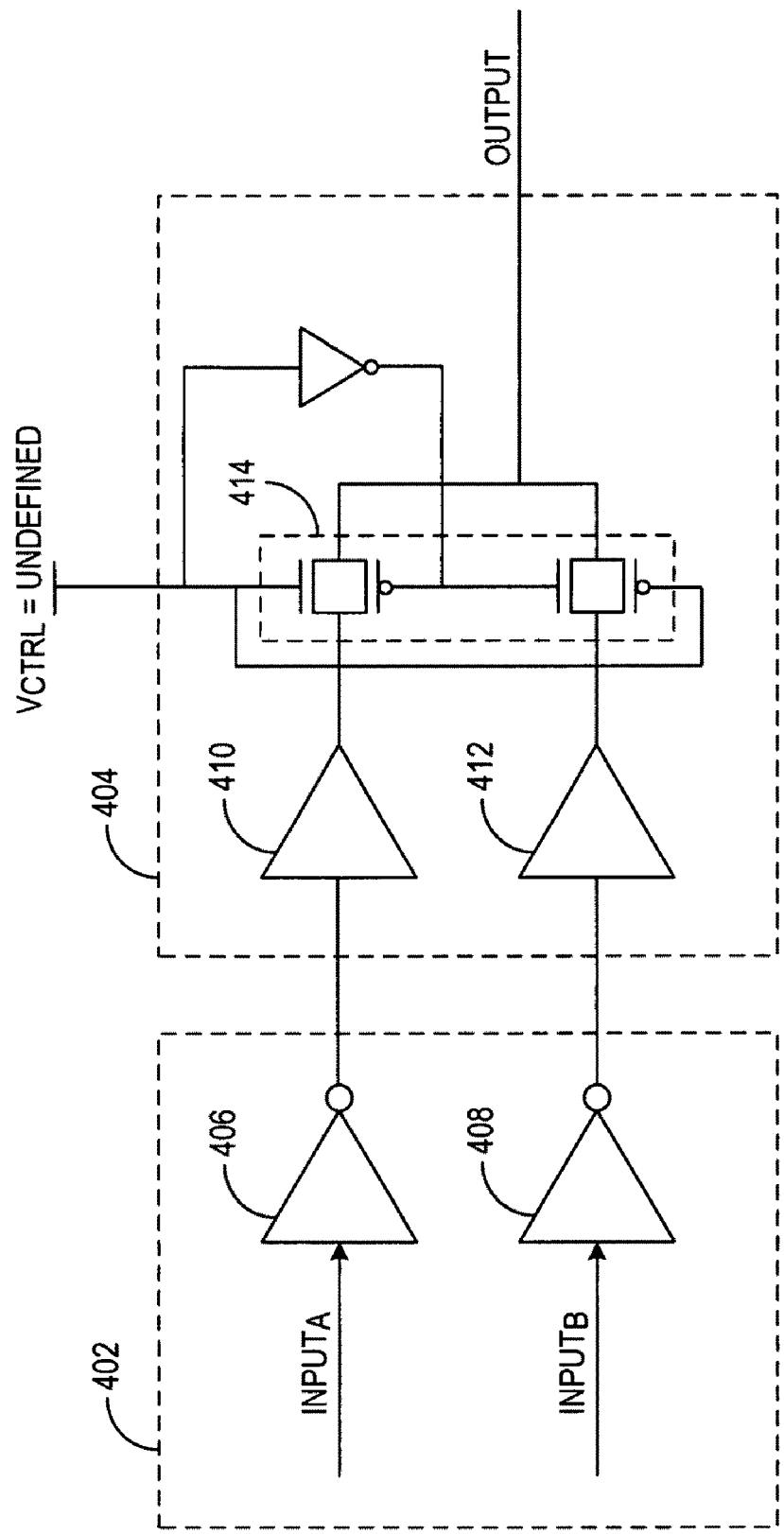
FIG. 4 illustrates an exemplary short circuit protection schematic diagram for a power gated logic block.

Turning to FIG. 4, an exemplary embodiment of a short-circuit prevention schematic is illustrated, whereby power gated block 404 interfaces with logic block 402. Logic block 402 is void of power gating transistors or has power gating transistors that are set in their active mode. In certain instances, e.g., when power gated block 404 is rendered inactive via its power gating transistor (not shown), the inverted control signal to multiplexer 414 is at an undefined voltage magnitude. Thus, the individual transmission gates of multiplexer 414 may be rendered weakly conductive by control signal $V_{CTRL}$.

In the absence of buffers 410-412, therefore, a leakage current path could exist from inverter 406, through multiplexer 414, back to inverter 408. Thus, buffers 410 and 412 may be placed in series with the potential leakage current path, thereby establishing a high impedance, in order to prevent such an occurrence. It should be noted that buffers 410 and 412 contain transistors having a gate oxide thickness that is less than the gate oxide thickness of the power gating transistors.

Figure 5:
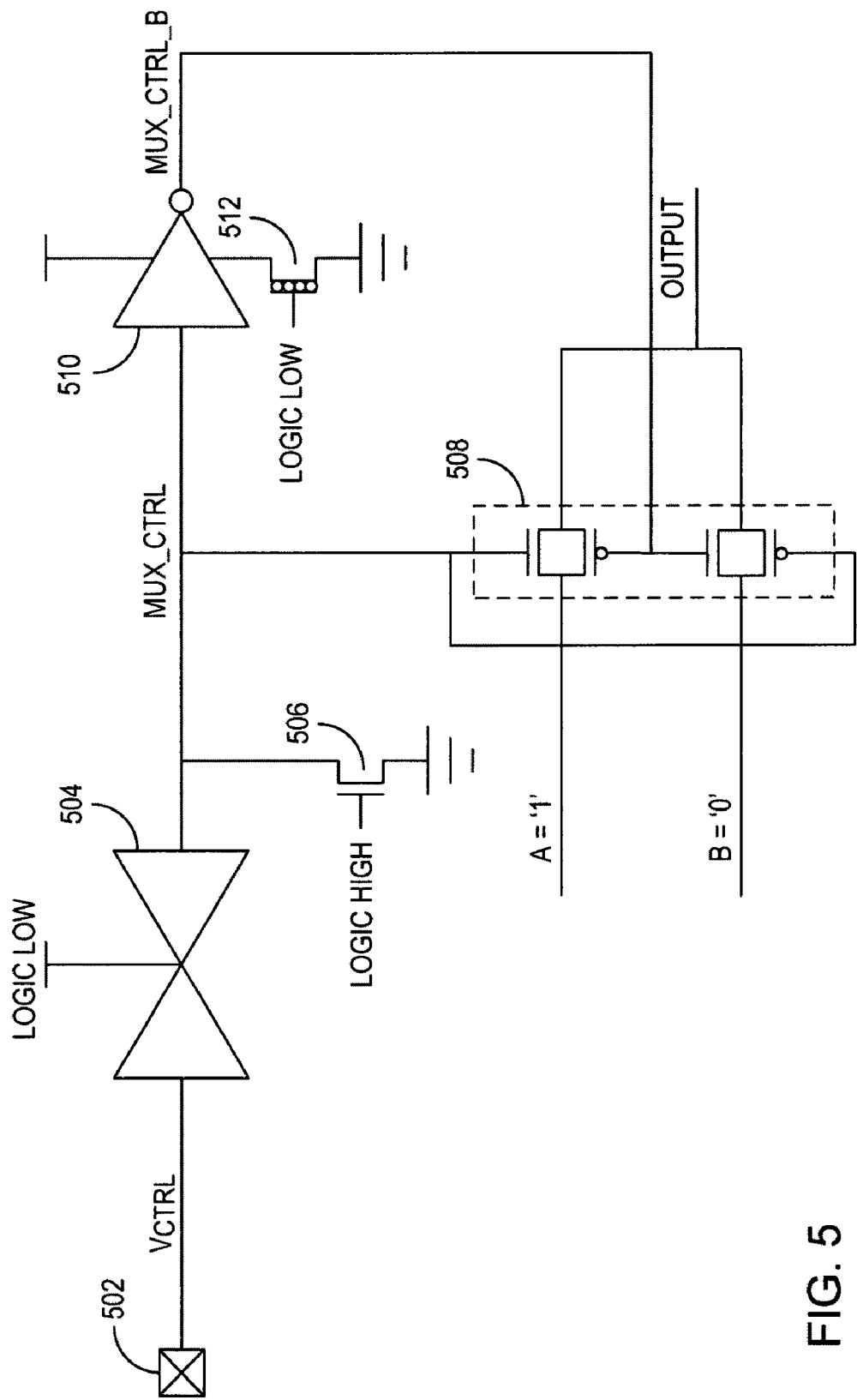
FIG. 5 illustrates an alternate embodiment of an exemplary short circuit protection schematic diagram for a power gated logic block.

Turning to FIG. 5, an alternate embodiment of a short-circuit prevention schematic is exemplified, wherein inverter 510 is inactive, i.e., it is isolated from its power supply reference, e.g., ground potential, via power gating transistor 512. Under the illustrated conditions and in the absence of transmission gate 504 and transistor 506, memory cell 502 may be configured to output a logic high value to the input of inverter 510.

However, given that power gating transistor 512 is deactivated by a logic low value at the gate terminal of power gating transistor 512, then inverter 510 is isolated from its power supply reference due to the non-conductive state of power gating transistor 512. Thus, the output of inverter 510, MUX_CTRL_B, is undefined, which in turn, may render multiplexer 508 into a short circuit condition, whereby both transmission gates of multiplexer 508 may be weakly conductive. Under these conditions and given that input A is at a logic high value and input B is at a logic low value, then a leakage current path may exist from the logic circuit (not shown) that is providing input A to the logic circuit (not shown) that is providing input B via multiplexer 508.

Thus, during the inactive state of inverter 510 as illustrated in FIG. 5, thin-oxide transistor 506 may be utilized to control the logic value of signal MUX_CTRL at the input of inverter 510. Since the power supply connection to inverter 510 is not power gated, inverter 510 may render multiplexer control signal MUX_CTRL_B to a solid logic high value. Additionally, since multiplexer control signal MUX_CTRL is at a solid logic low value, multiplexer 508 deselects input A and selects input B, thus preventing a potential short-circuit condition during the inactive state of inverter 510. Pass gate 504 may be utilized to isolate memory cell 502 from signal MUX_CTRL when memory cell 502 is configured to an active high level, in order to prevent a current path from existing through transistor 506.

Figure 6B:
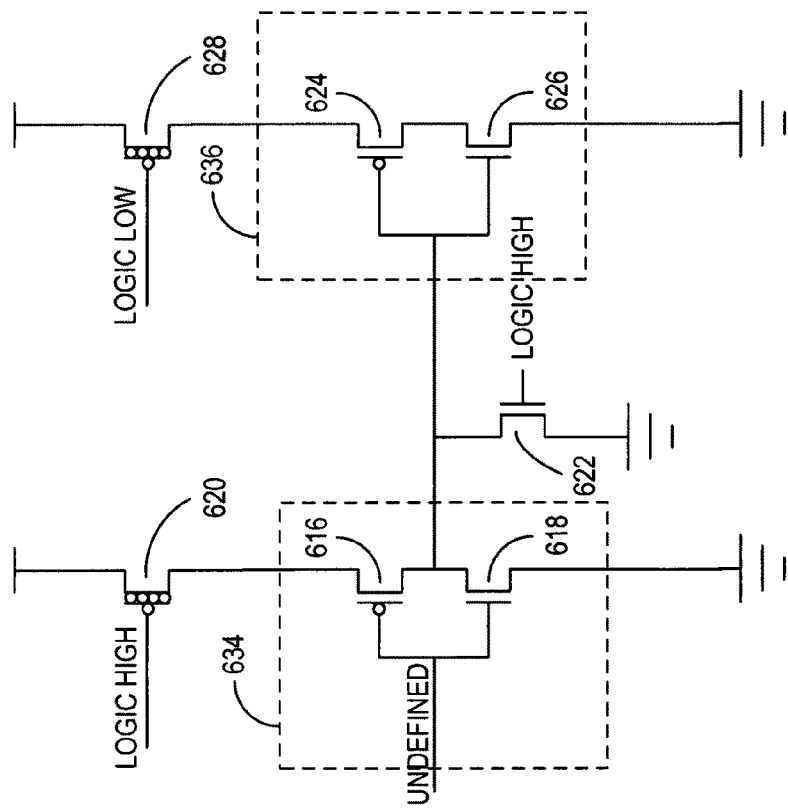
FIGS. 6A-6B illustrate alternate embodiments of exemplary short circuit protection schematic diagrams for a power gated logic block.
Figure 6A:
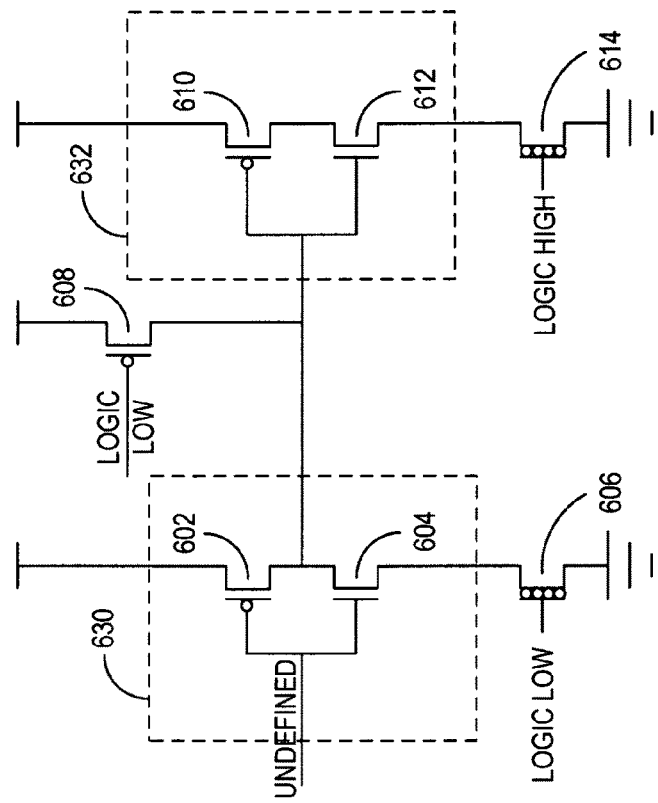

Turning to FIGS. 6A and 6B, an illustration of a potential short circuit condition is exemplified, in which a logic block is deactivated via power gating and is subsequently driving an active logic block. In FIG. 6A, for example, logic block 630 is isolated from its power supply reference via deactivated power gating transistor 606 and is thus deactivated. In addition, the input signal to logic block 630 is in an undefined logic state. In this instance, therefore, logic block 630 is being isolated from the voltage supply reference via power gating transistor 606.

Logic block 632, on the other hand, is activated through the activation of power gating transistor 614, which is providing a virtual connection from logic block 632 to the voltage supply reference. In the absence of pull-up transistor 608, the output of inverter 602, 604 is undefined, which could render transistors 610 and 612 weakly conductive. In such an instance, a short circuit path could exist through transistors 610-614.

In order to prevent the potential short circuit condition, therefore, pull-up transistor 608 is used to deliver a known logic state, i.e., a logic high level, to the input of inverter 610, 612. As such, transistor 610 is rendered non-conductive, thus preventing the short circuit path through transistors 610-614. Thus, in the event that power gating to a voltage supply reference is utilized, as shown in FIG. 6A, pull-up transistor 608 may be utilized between inactive block 630 and active block 632.

Turning to FIG. 6B, on the other hand, power gating to the voltage supply via power gating transistors 620 and 628 is exemplified. Logic block 634 is isolated from its power supply via deactivated power gating transistor 620 and is thus deactivated. In addition, the input signal to logic block 634 is in an undefined logic state. In this instance, therefore, logic block 634 is being isolated from the voltage supply via power gating transistor 620.

Logic block 636, on the other hand, is activated through the activation of power gating transistor 628, which is providing a virtual connection from logic block 636 to the voltage supply. In the absence of pull-down transistor 622, the output of inverter 616, 618 is undefined, which could render transistors 624 and 626 weakly conductive. In such an instance, a short circuit path could exist through transistors 624-628.

In order to prevent the potential short circuit condition, therefore, pull-down transistor 622 is used to deliver a known logic state, i.e., a logic low level, to the input of inverter 624, 626. As such, transistor 626 is rendered non-conductive, thus preventing the short circuit path through transistors 624-628. Thus, in the event that power gating to a voltage supply is utilized, as shown in FIG. 6B, pull-down transistor 622 may be utilized between inactive block 634 and active block 636.

It should be noted that while transistors 608 and 622 are illustrated as thin-oxide devices, any oxide thickness may be used. For example, given that logic blocks 630-636 are implemented with thin-oxide devices, it may be most convenient to implement transistors 608 and 622 as thin-oxide devices as well. Alternately, transistors 608 and 622 may be conveniently implemented using thick-oxide devices, if logic blocks 630-636 are, for example, located within proximity to power gating transistor blocks 320, 324, 328, and/or 332 as discussed above in relation to FIG. 3.

Figure 7A:
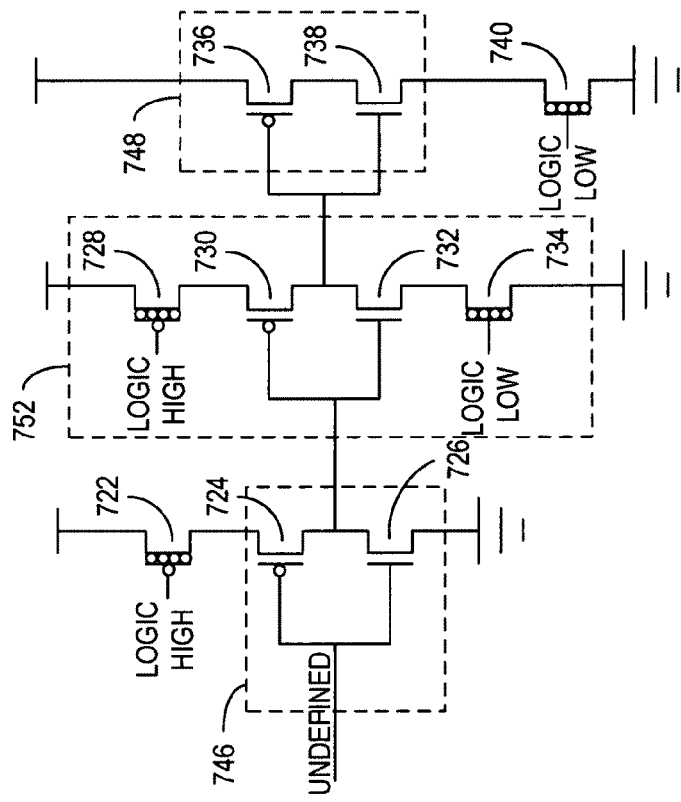
FIGS. 7A-7B illustrate alternate embodiments of exemplary short circuit protection schematic diagrams for a power gated logic block.
Figure 7B:
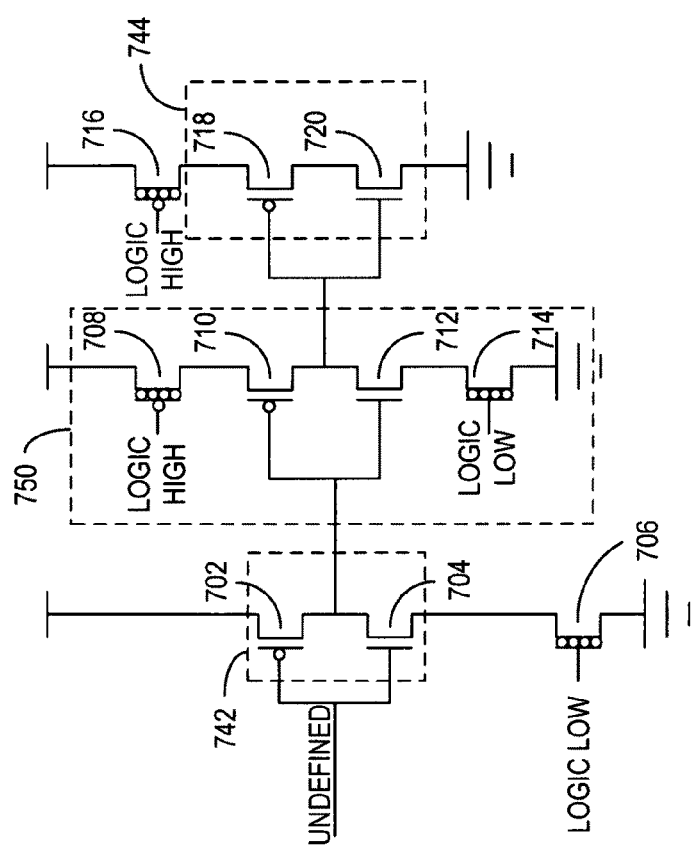

Turning to FIGS. 7A and 7B, alternate embodiments are exemplified in which an interface stage using both N-type and P-type power gating transistors is used between an inactive power gated block and an active power gated block. In other words, a current path may exist between a first logic block that utilizes N-type power gating to the voltage supply reference and a second logic block that utilizes P-type power gating to the voltage supply. Conversely, a current path may exist between a first logic block that utilizes P-type power gating to the voltage supply and a second logic block that utilizes N-type power gating to the voltage supply reference.

Turning to FIG. 7A, for example, inactive logic block 742 is power gated to the voltage supply reference via N-type power gating transistor 706. Active block 744, on the other hand, is power gated to the voltage supply via P-type power gating transistor 716. In the absence of interface stage 750, a current path may exist from the voltage supply through weakly conductive transistors 702, 720 to the voltage supply reference.

Thus, interface stage 750, comprising thick-oxide transistors 708, 714 and thin-oxide transistors 710, 712, is implemented between active block 744 and inactive block 742 in the exemplary configuration of FIG. 7A. As such, power gating transistors 708, 714 cut off any current path that may otherwise exist due to the gate leakage of thin-oxide transistors 710, 712.

Turning to FIG. 7B, inactive logic block 746 is power gated to the voltage supply via P-type power gating transistor 722. Active block 748, on the other hand, is power gated to the voltage supply reference via P-type power gating transistor 740. In the absence of interface stage 752, a current path may exist from the voltage supply through weakly conductive transistors 736, 726 to the voltage supply reference.

Thus, interface stage 752, comprising thick-oxide transistors 728, 734 and thin-oxide transistors 730, 732, is implemented between active block 748 and inactive block 746 in the exemplary configuration of FIG. 7B. As such, power gating transistors 728, 734 cut off any current path that may otherwise exist due to the gate leakage of thin-oxide transistors 730, 732.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A circuit, comprising:
    a first logic block coupled to a first voltage node through a first transistor, the first transistor exhibiting a thicker gate oxide relative to transistors of the first logic block;
    a second logic block coupled to a second voltage node through a second transistor, the second transistor exhibiting a thicker gate oxide relative to transistors of the second logic block; and
    an interface block coupled between an output of the first logic block and an input of the second logic block, the interface block substantially preventing leakage current conduction between the first and second logic blocks, the interface block including,
        a third transistor coupled to the first voltage node; and
        a fourth transistor coupled to the second voltage node, wherein the third and fourth transistors exhibit a gate oxide thickness substantially equal to the gate oxide thickness of the first and second transistors.

2. The circuit of claim 1, further comprising a voltage supply reference coupled to the first voltage node, wherein the first transistor is of a first conductivity type.

3. The circuit of claim 2, further comprising a voltage supply coupled to the second voltage node, wherein the second transistor is of a second conductivity type.

4. The circuit of claim 1, further comprising a voltage supply coupled to the first voltage node, wherein the first transistor is of a second conductivity type.

5. The circuit of claim 4, further comprising a voltage supply reference coupled to the second voltage node, wherein the second transistor is of a first conductivity type.

6. The circuit of claim 1, further comprising an interface block coupled between an output of the first logic block and an input of the second logic block, wherein the interface block comprises a pull-up transistor of a second conductivity type coupled to a voltage supply, the pull-up transistor exhibiting a gate oxide thickness substantially equal to the gate oxide thickness of the transistors of the first and second logic blocks.

7. The circuit of claim 6, further comprising a voltage supply reference coupled to the first and second voltage nodes, wherein the first and second transistors are of a first conductivity type.

8. The circuit of claim 1, further comprising an interface block coupled between an output of the first logic block and an input of the second logic block, wherein the interface block comprises a pull-down transistor of a first conductivity type coupled to a voltage supply reference, the pull-down transistor exhibiting a gate oxide thickness substantially equal to the gate oxide thickness of the transistors of the first and second logic blocks.

9. The circuit of claim 8, further comprising a voltage supply coupled to the first and second voltage nodes, wherein the first and second transistors are of a second conductivity type.

10. An integrated circuit (IC) configured to reduce leakage current, comprising:
    plurality of logic blocks each logic block including logic transistors having a first gate oxide thickness;
    a plurality of memory cell blocks, each memory cell block including a plurality of memory cells, wherein the memory cells include transistors having a second gate oxide thickness;
    a plurality of power gating blocks, each power gating block including a plurality of power gating transistors having the second gate oxide thickness;
    wherein the plurality of power gating blocks are located adjacent to the plurality of memory cell blocks; and
    wherein the plurality of power gating transistors are adapted to provide programmable power supply and power supply reference connections to the logic blocks to substantially reduce leakage current from the logic blocks.

11. The IC of claim 10 wherein one of the plurality of power gating transistors is of a first conductivity type and is programmed to connect one of the plurality of logic blocks to the power supply.

12. The IC of claim 11, wherein the one of the plurality of power gating transistors is programmed to disconnect the one of the plurality of logic blocks from the power supply.

13. The IC of claim 10, wherein one of the plurality of power gating transistors is of a second conductivity type and is programmed to connect one of the plurality of logic blocks to the power supply reference.

14. The IC of claim 13, wherein the one of the plurality of power gating transistors is programmed to disconnect the one of the plurality of logic blocks from the power supply reference.

15. A leakage current reduction circuits comprising;
    a first logic block void of power gating transistors, the first logic block including transistors of a first gate oxide thickness;
    a second logic block coupled to the first logic block, the second logic block including a power gating transistor having a second gate oxide thickness greater than the first gate oxide thickness, wherein the power gating transistor adaptively couples the second logic block to a voltage node; and
    an interface circuit coupled between the first and second logic blocks, the interface circuit including a plurality of buffers, each buffer coupled to receive signals from the first logic block and coupled to provide the signals to the second logic block.

16. The leakage current reduction circuit of claim 15, further comprising an interface circuit coupled between the first and second logic blocks, the interface circuit including a transistor coupled to the voltage node.

17. The leakage current reduction circuit of claim 16, wherein the transistor is of a first conductivity type and the voltage node is a voltage supply node.

18. The leakage current reduction circuit of claim 16, wherein the transistor is of a second conductivity type and the voltage node is a voltage supply reference node.

* * * * *